(12) United States Patent
Yamashita et al.

(10) Patent No.: US 7,081,677 B2
(45) Date of Patent: Jul. 25, 2006

(54) THERMOELECTRIC MODULE

(75) Inventors: Masayoshi Yamashita, Hamamatsu (JP); Naoki Kamimura, Hamamatsu (JP); Fumiyasu Tanoue, Hamamatsu (JP); Katsuhiko Onoue, Hamamatsu (JP); Toshiharu Hoshi, Iwata-gun (JP)

(73) Assignee: Yamaha Corporation (JP)

( * ) Notice: Subject to any disclaimer, the term of this patent is extended or adjusted under 35 U.S.C. 154(b) by 0 days.

(21) Appl. No.: 10/393,452

(22) Filed: Mar. 21, 2003

(65) Prior Publication Data

US 2003/0183839 A1 Oct. 2, 2003

(30) Foreign Application Priority Data

Mar. 26, 2002 (JP) .......................... P2002-086914

(51) Int. Cl.
*H01L 35/28* (2006.01)

(52) U.S. Cl. ............... 257/773; 257/930; 257/E27.008; 438/54

(58) Field of Classification Search ................. 257/773
See application file for complete search history.

(56) References Cited

U.S. PATENT DOCUMENTS

| 5,409,547 | A | * | 4/1995 | Watanabe et al. ........... 136/204 |
| 5,515,238 | A | * | 5/1996 | Fritz et al. .................. 361/704 |
| 5,715,684 | A | * | 2/1998 | Watanabe et al. ............. 62/3.2 |
| 6,300,150 | B1 | * | 10/2001 | Venkatasubramanian ..... 438/27 |

FOREIGN PATENT DOCUMENTS

JP 10-313150 11/1998

* cited by examiner

*Primary Examiner*—Jerome Jackson
(74) *Attorney, Agent, or Firm*—Dickstein, Shapiro, Morin & Oshinsky, LLP.

(57) ABSTRACT

A thermoelectric module is constituted by a pair of substrates having electrodes, which are arranged opposite to each other with a prescribed space therebetween, in which a prescribed number of thermoelectric elements are arranged in such a way that a p-type and an n-type are alternately arranged, so that the thermoelectric elements are connected in series or in parallel together with the electrodes. Herein, one substrate is a heat absorption side, and other substrate is a heat radiation side. In addition, a current density in a current transmission area of the heat-absorption-side electrode is set to 50 A/mm$^2$ or less, and a height of the thermoelectric element is set to 0.7 mm or less. Furthermore, a temperature-controlled semiconductor module can be realized by combining a thermoelectric module with a semiconductor component such as a semiconductor laser.

4 Claims, 6 Drawing Sheets

CORRELATION BETWEEN CURRENT DENSITY AND ΔTmax

HEIGHT OF THERMOELECTRIC COMPONENT (mm)

EFFECT OF CURRENT DENSITY IN EXCITATION LASER MODULE

THERMOELECTRIC MODULE

BACKGROUND OF THE INVENTION

1. Field of the Invention

This invention relates to thermoelectric modules having endothermic properties for absorbing heat from electronic components and the like.

2. Description of the Related Art

A conventional example of a thermoelectric module comprising an upper substrate 2 and a lower substrate 1 will be described with reference to FIGS. 6 to 9, wherein FIG. 6 is a plan view showing the upper substrate 2, FIG. 7 is a right side view, FIG. 8 is a front view, and FIG. 9 is a plan view showing the lower substrate 1. The upper substrate 2 and the lower substrate 1, both of which are made of alumina, are arranged opposite to each other with a prescribed space therebetween, in which upper electrodes 5 are arranged on the upper substrate 2, and lower electrodes 6 are arranged on the lower substrate 1. The upper electrodes 5 and the lower electrodes 6 are alternately arranged to sandwich different types of thermoelectric elements 3 therebetween. Specifically, p-type thermoelectric elements and n-type thermoelectric elements are alternately arranged between the upper electrodes 5 and the lower electrodes 6 except a leftmost lower electrode 6a. A single n-type thermoelectric element is only arranged for the leftmost lower electrode 6a, which is connected with a lead 7. In FIGS. 6 to 9, symbols of arrows show directions of currents flowing through the thermoelectric module. That is, a current flows through the leftmost lower electrode 6a (see FIG. 8), from which the current flows into the upper electrode 5 via the n-type thermoelectric element; and then, the current flows into the lower electrode 6 adjoining the leftmost lower electrode 6a via the p-type thermoelectric element. As described above, the current sequentially flows through the lower electrode 6, n-type thermoelectric element 3, upper electrode 5, p-type thermoelectric element 3, and lower electrode 6 in turn. Due to the Peltier effect, heat is extracted from the upper substrate 2 and is then transferred to the lower electrode 1. Therefore, an electronic component mounted on the surface of the upper substrate 2 is cooled, so that heat is radiated from the lower substrate 1. Both the upper electrodes 5 and the lower electrodes 6 have the same thickness, which ranges from 50 μm to 100 μm, for example.

In the case of a thermoelectric module having a relatively large maximal endothermic value Qcmax, a current flowing through electrodes may become large and range from 5A to 10A, for example. This causes great heating values at electrodes, which may deteriorate performance of the thermoelectric module.

Incidentally, the maximal endothermic value Qcmax is defined with respect to a thermoelectric module having a heat absorbing side and a heat radiating (or emitting) side, wherein it is determined as an endothermic value that is produced when a difference between temperature (Tc) of the heat absorbing side, on which a heater is mounted, and temperature (Th) of the heat radiating side becomes zero (i.e., 0° C., where Th=Tc=27° C., for example).

SUMMARY OF THE INVENTION

It is an object of the invention to provide a thermoelectric module that can be reduced in Joule heat even when a maximal endothermic value Qcmax is increased. In particular, it is an object of the invention to provide a thermoelectric module whose maximal endothermic value Qcmax is 12 W or more, in which Joule heat can be reduced.

A thermoelectric module of this invention is constituted by a pair of substrates having electrodes, which are arranged opposite to each other with a prescribed space therebetween, in which a prescribed number of thermoelectric elements are arranged in such a way that a p-type and an n-type are alternately arranged, so that the thermoelectric elements are connected in series or in parallel together with the electrodes. Herein, one substrate is a heat absorption side, and the other substrate is a heat radiation side.

In the above, a current density in a current transmission area of the heat-absorption-side electrode is set to 50 A/mm² or less, and a height of the thermoelectric element is set to 0.7 mm or less.

In addition, a temperature-controlled semiconductor module can be realized by combining a thermoelectric module with a semiconductor component such as a semiconductor laser. Herein, the thermoelectric module of this invention can effectively reduce electric power consumption thereof particularly with respect to the semiconductor component having an endothermic value of 4 W or more.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENTS

This invention will be described in further detail by way of examples with reference to the accompanying drawings.

Figure 1:
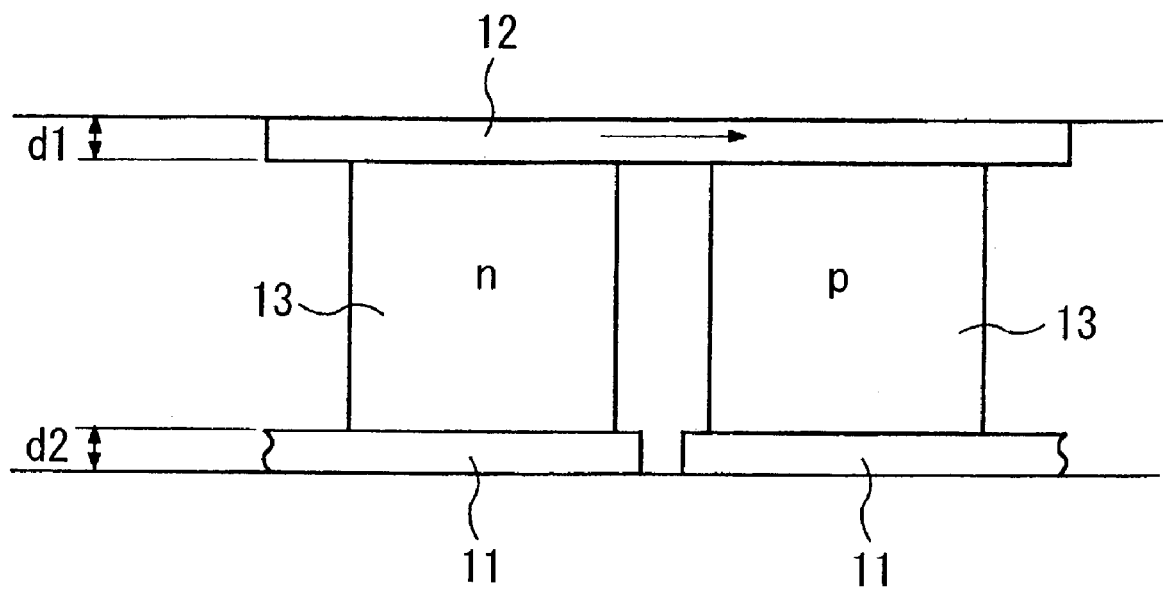
FIG. 1 is a front view showing an essential structure of a thermoelectric module in accordance with a preferred embodiment of the invention.
Figure 2:
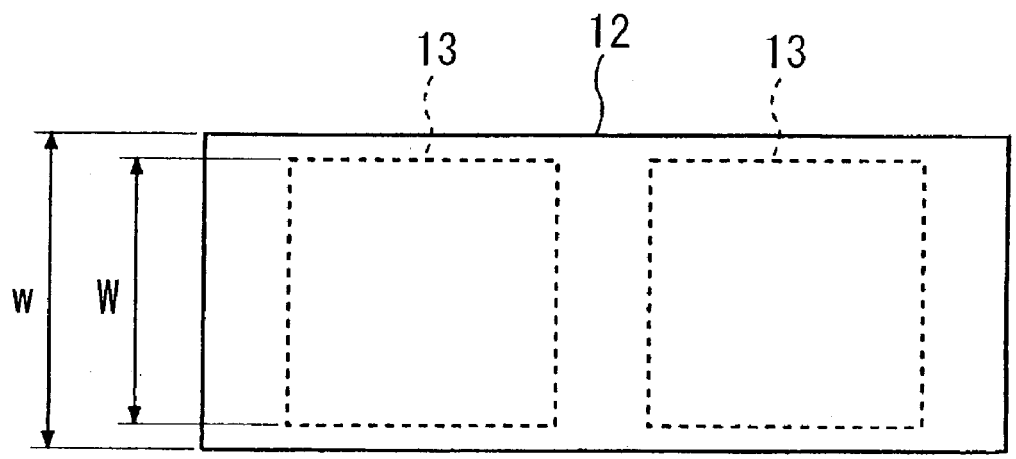
FIG. 2 is a plan view of the thermoelectric module.

FIG. 1 is a front view showing the essential structure of a thermoelectric module containing electrodes and thermoelectric elements in accordance with a preferred embodiment of the invention; and FIG. 2 is a plan view of the thermoelectric module. Herein, a pair of thermoelectric elements 13 consisting of an n-type and a p-type are arranged to adjoin together on a pair of lower electrodes 11 respectively, wherein they are both connected with an upper electrode 12. As similar to the conventional example of the thermoelectric module shown in FIGS. 4 to 7, all the lower electrodes 11, upper electrode 12, and thermoelectric elements 13 are connected together, wherein the upper electrode 12 acts as a heat absorbing side (or a cooling side). Compared with the lower electrodes 11 that act as a heat radiating side, the upper electrode 12 acting as the heat absorbing side has a larger sectional area allowing transmission of a current therethrough (hereinafter, referred to as a current transmission area), which is determined in response to a drive current of the upper electrode 12 in such a way that a current density thereof becomes equal to 50 A/mm$^2$ or less. In addition, the thermoelectric element 13 has a prescribed height, which is equal to 0.7 mm or less, for example.

That is, the present embodiment is designed in such a way that the upper electrode 12 corresponding to the heat absorbing side is increased in current transmission area compared with the lower electrodes 11 corresponding to the heat radiating side, wherein the current density of the upper electrode 12 is set to 50 A/mm$^2$ or less, for example. Herein, a current density "i" representing a current flowing through the upper electrode 12, which corresponds to the heat absorbing side of the thermoelectric module, can be calculated by the following equation (see FIGS. 1 and 2), $$i = \frac{I}{W \cdot d1}$$

where d1 denotes the thickness of the upper electrode 12, w denotes the width of the upper electrode 12, W denotes the width of the thermoelectric element 13, and I denotes a drive current.

Figure 3:
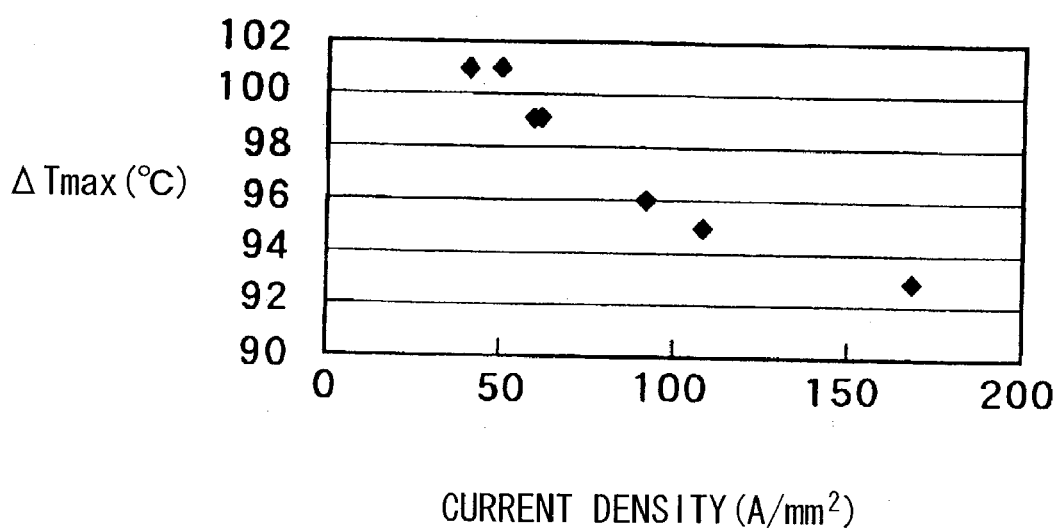
FIG. 3 is a graph showing a relationship between a current density of a current flowing through a prescribed electrode and a maximal value ΔTmax of temperature difference between electrodes.

Now, ΔTmax represents a maximal value of a temperature difference between the upper electrode 12 and the lower electrode(s) 11, which construct the thermoelectric module. We, the inventors, have examined relationships between the current density i and the maximal temperature difference ΔTmax representing performance of the thermoelectric module, wherein it is possible to provide a graph shown in FIG. 3, which shows that ΔTmax becomes extremely large (i.e., 100° C. or more) under the condition where the current density i is equal to 50 A/mm$^2$ or less. In particular, this effect is closely related to the current density i measured in the upper electrode 12 corresponding to the heat absorbing side, wherein the performance of the thermoelectric module may be greatly reduced when the current density of the upper electrode 12 exceeds a prescribed value of 50 A/mm$^2$. For this reason, the present embodiment is designed in such a way that the current density i of a heat-absorbing-side electrode becomes 50 A/mm$^2$ or less when determining a current transmission area (W×d1) of the heat-absorbing-side electrode in response to a drive current. That is, the width W of the thermoelectric element 13 and the width d1 of the electrode are determined to satisfy a prescribed inequality as follows:

$$\frac{I}{(W \times d1)} \leq 50 \text{ or}$$

$$W \times d1 \geq \frac{I}{50}$$

Within parameters required for increasing the maximal endothermic value Qcmax in the thermoelectric module, we have particularly paid attention to the height of the thermoelectric element because of the following reasons.

The following three parameters are required for increasing the maximal endothermic value Qcmax.

(a) Sectional area of the thermoelectric element to be increased.

(b) Total sectional area of the thermoelectric element to be increased.

(c) Height of the thermoelectric element to be reduced.

Among these parameters, first an second parameters have prescribed limits in designs, which will be described below.

(a) In order to set a drive voltage of the thermoelectric module into a prescribed range between 2V and 3V, for example, the sectional area of the thermoelectric element may not be increased beyond a prescribed limit, which may range between 0.8 mm$^2$ and 1 mm$^2$.

(b) Because of the need to provide an insulation space between adjacent electrodes, even when a maximal number of thermoelectric elements are arranged in the thermoelectric module, the total sectional area of all the thermoelectric elements may not be increased beyond a prescribed percentage (e.g., 60% or so) compared with the total substrate area.

Figure 4:
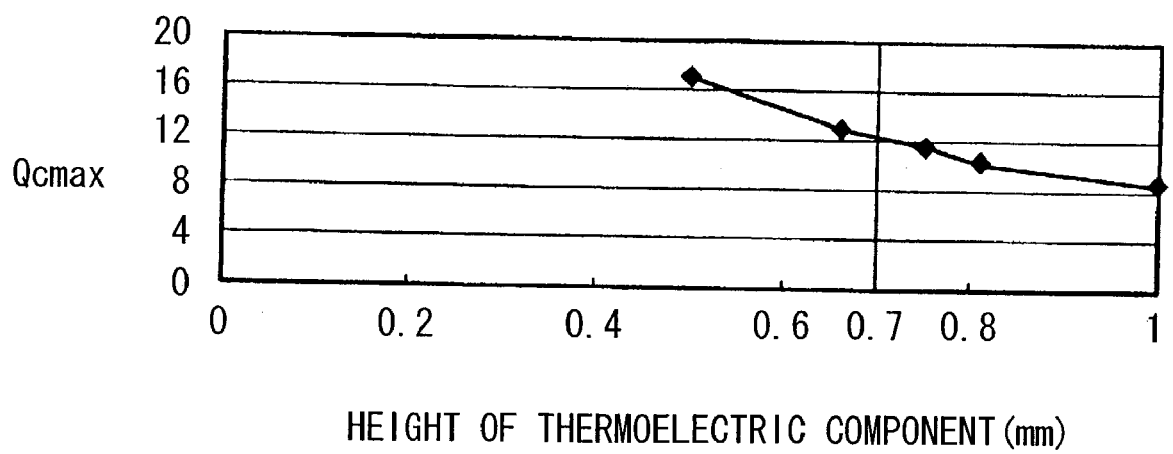
FIG. 4 is a graph showing a relationship between the height of a thermoelectric element and a maximal endothermic value Qcmax.
Figure 5:
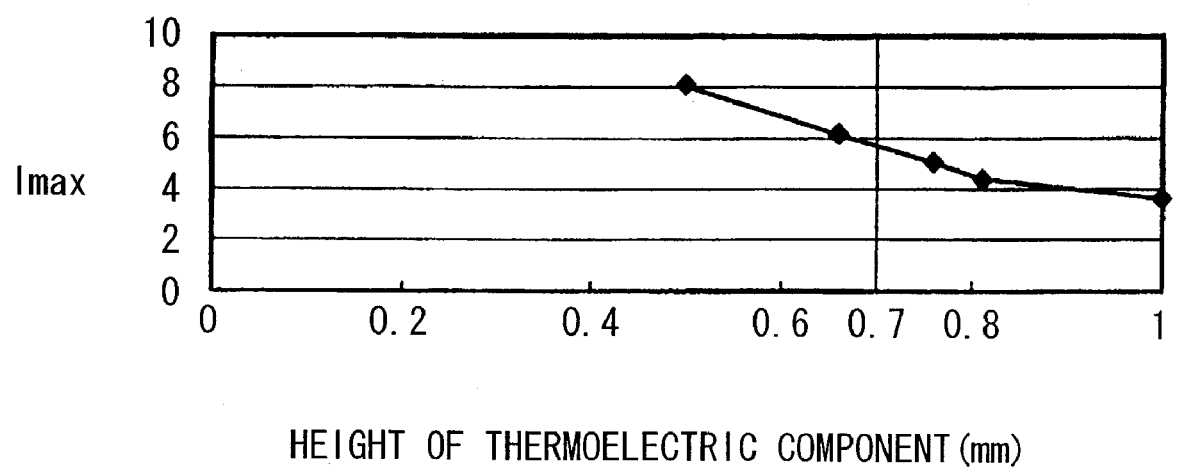
FIG. 5 is a graph showing a relationship between the height of a thermoelectric element and a maximal value Imax of a current flowing through the thermoelectric element.
Figure 6:
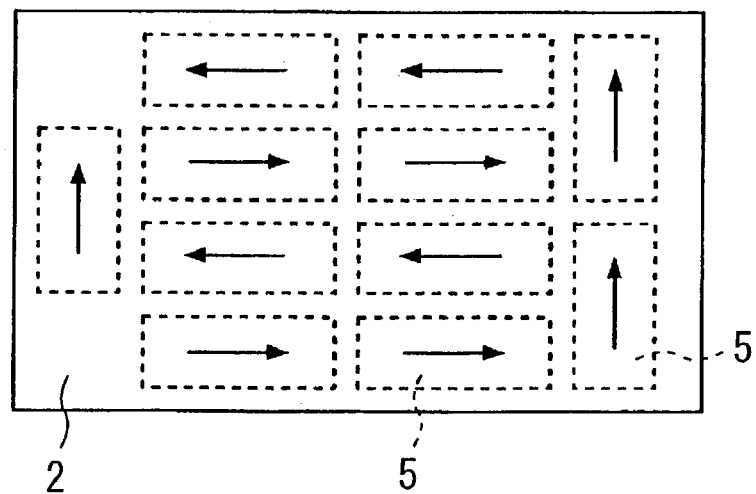
FIG. 6 is a plan view showing an upper substrate used in a conventional example of a thermoelectric module.
Figure 7:
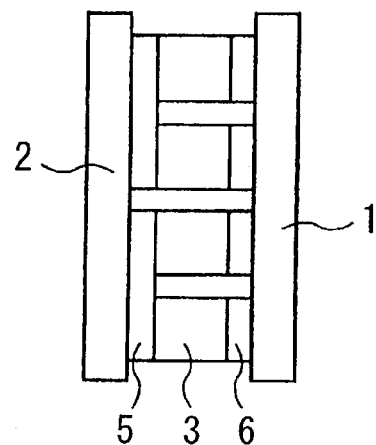
FIG. 7 is a right side view of the thermoelectric module.
Figure 8:
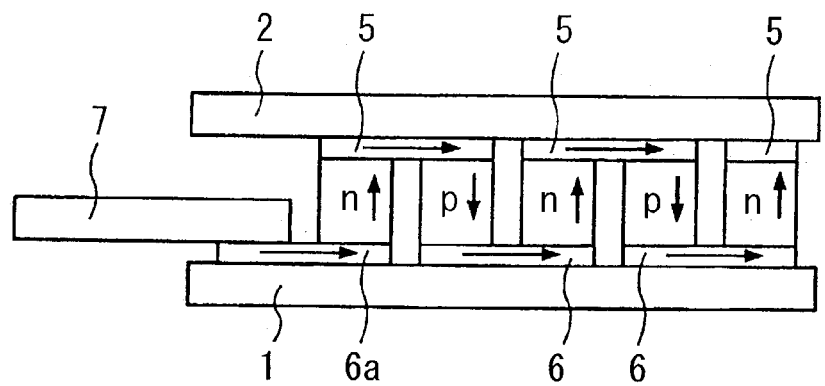
FIG. 8 is a front view of the thermoelectric module.
Figure 9:
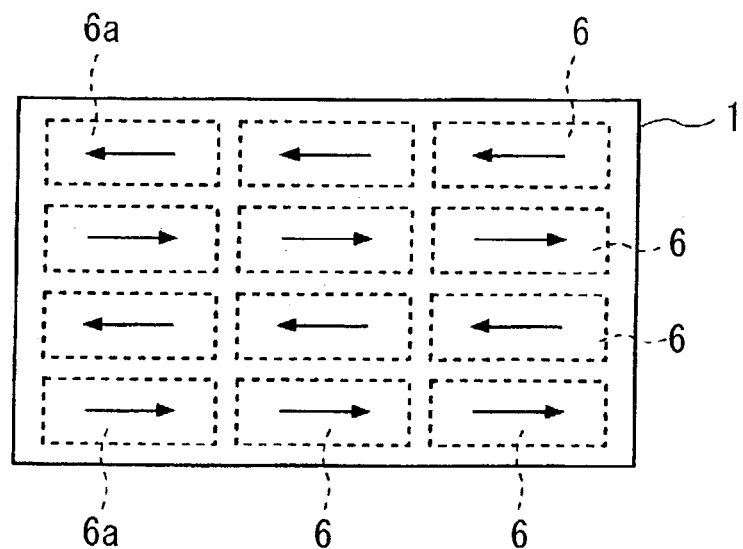
FIG. 9 is a plan view showing a lower substrate of the thermoelectric module.

As described above, it is necessary to reduce the height of the thermoelectric element in order to increase the maximal endothermic value Qcmax of the thermoelectric module. The aforementioned graph of FIG. 5 shows that as the height of the thermoelectric element decreases, it is possible to increase a maximal value Imax of a current flowing through the thermoelectric element. Thus, it is realized from a graph of FIG. 4 that Qcmax becomes equal to 12 W or more when the height of the thermoelectric element is equal to 0.7 mm or less.

In the above, the maximal endothermic value Qcmax of the thermoelectric module can be increased as the height of the thermoelectric element 13 decreases, so that it is possible to increase a cooling efficiency of the thermoelectric module. In order to obtain a satisfactory cooling effect, it is necessary to reduce the height of the thermoelectric element 13 to be equal to 0.7 mm or less. FIG. 4 is a graph in which a horizontal axis represents the height of the thermoelectric element 13, and a vertical axis represents Qcmax, which is measured in units of watts (W). FIG. 4 shows that Qcmax becomes equal to approximately 12 W or more under the condition where the height of the thermoelectric element 13 is 0.7 mm or less. FIG. 5 is a graph in which a horizontal axis represents the height of the thermoelectric element, and a vertical axis represents a maximal value Imax of a current flowing through the thermoelectric element 13, wherein Imax is measured in units of amperes (A). FIG. 5 shows that Imax becomes extremely high to be approximately 6 A or more under the condition where the height of the thermoelectric element 13 is 0.7 mm or less.

Figure 10:
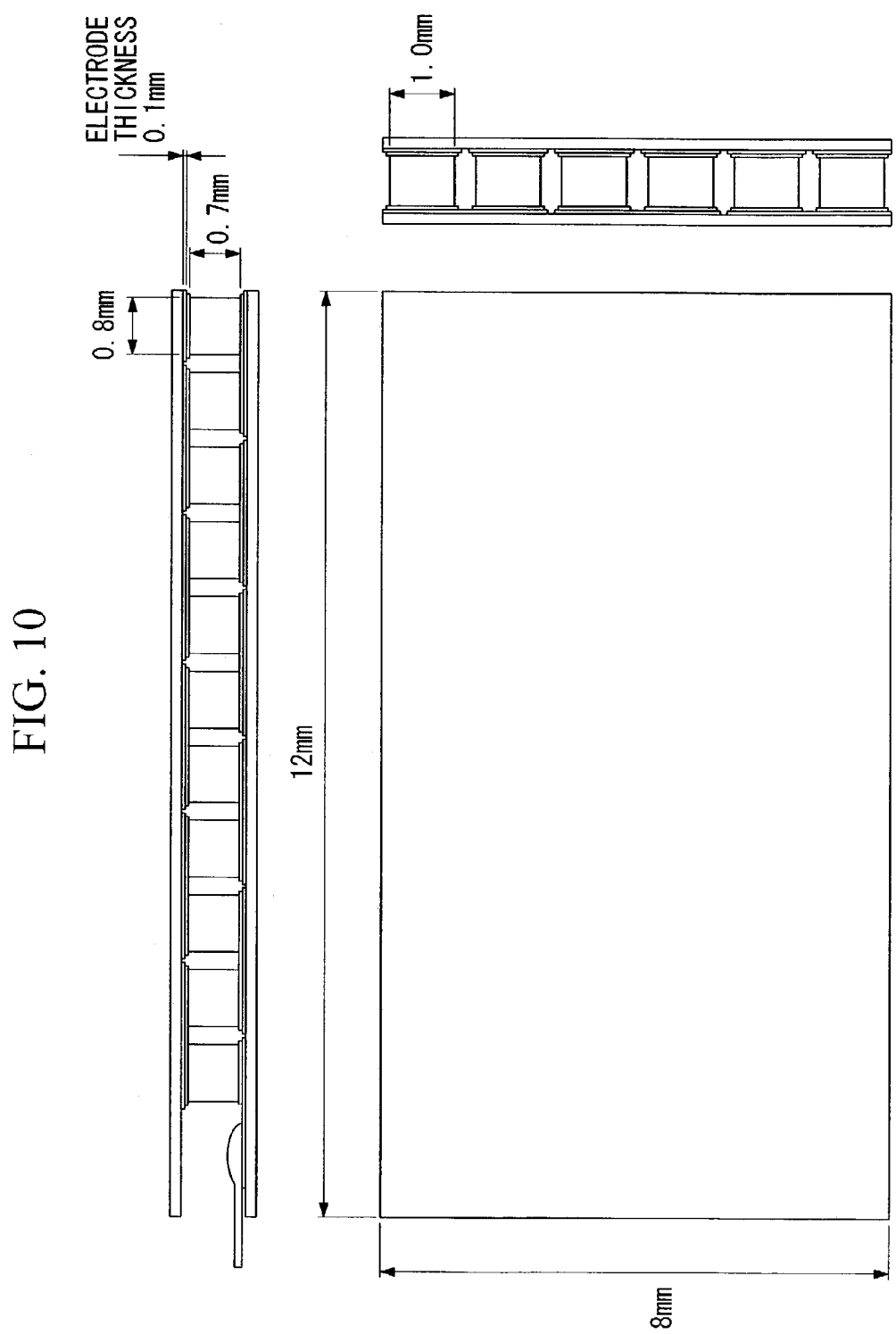
FIG. 10 diagrammatically shows the overall configuration of a thermoelectric module that is a sample produced for measurement.

FIG. 10 shows a sample of a thermoelectric module that is actually produced in conformity with the following dimensions.

Substrate size: 8 mm×12 mm

Size of thermoelectric element: 1 mm×0.8 mm×0.7 mm (height)

Electrode size: 1 mm (w)×0.1 mm (d1)

Total sectional area of thermoelectric elements: 57 mm$^2$

Measurement results of the aforementioned sample of the thermoelectric module are as follows:

Imax: 5 A i: 50 A/mm$^2$

Qcmax: 12 W

ΔTmax: 100° C.

Figure 11:
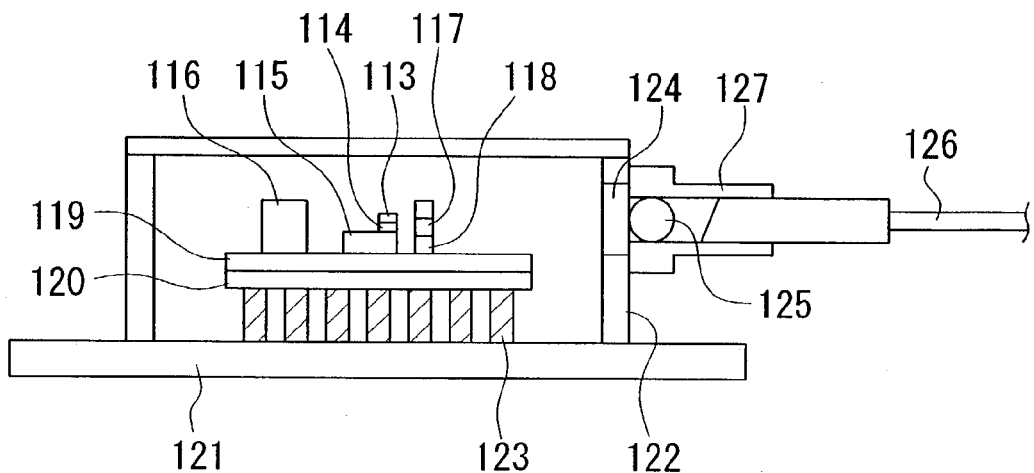
FIG. 11 is a cross sectional view showing an example of a temperature-controlled semiconductor module that contains a semiconductor laser and a thermoelectric module.

This invention may be applied to a temperature-controlled semiconductor module (see FIG. 11) in which a thermoelectric module is combined together with a semiconductor laser and the like for use in optical communications, for example. Herein, 113 designates a semiconductor laser, 114 designates a heatsink, 115 designates a header, 116 designates a light receiving element, 117 designates a lens, 118 designates a lens holder, 119 designates a base, 120 designates an insulation plate, 121 designates a board, 122 designates a side wall, 123 designates Peltier elements, 124 designates a light pickup window, 125 designates a lens, 126 designates an optical fiber, and 127 designates a sleeve.

Figure 12:
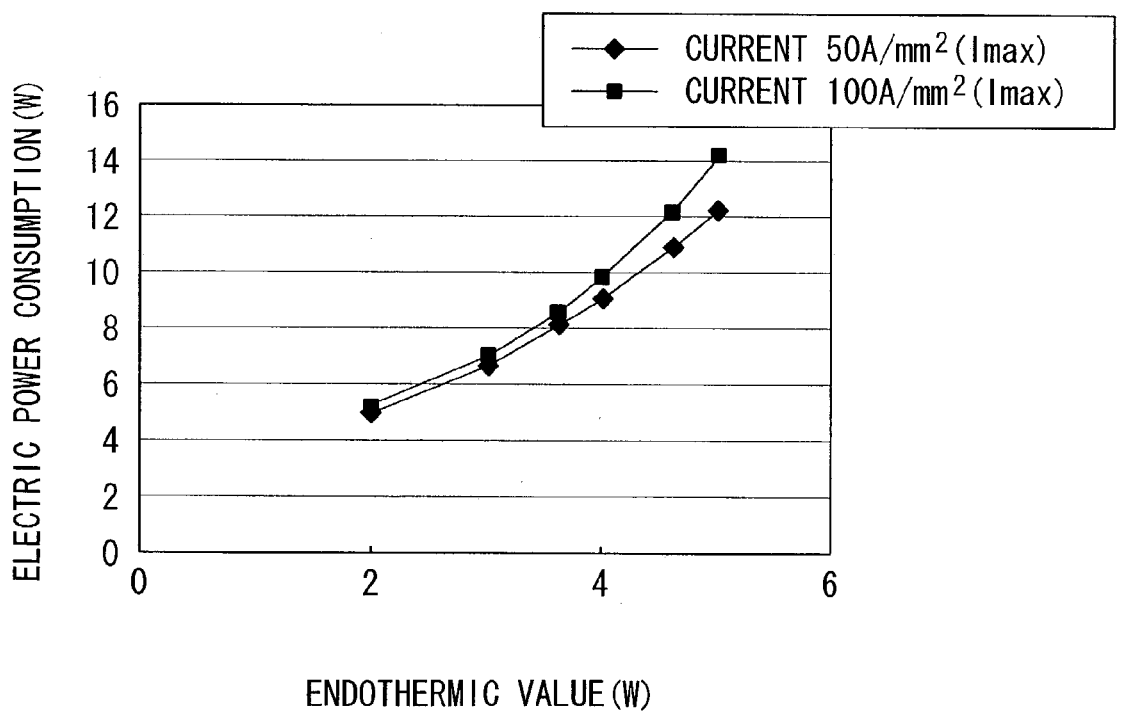
FIG. 12 is a graph showing relationships between electric power consumption and endothermic values, which are measured on samples of temperature-controlled semiconductor modules.

Samples of temperature-controlled semiconductor modules each containing a semiconductor laser (or an excitation laser) and a thermoelectric module are produced by controlling current transmission areas of electrodes in thermoelectric modules, wherein one sample realizes a current density of 50 A/mm$^2$ (Imax), and the other sample realizes a current density of 100 A/mm$^2$ (Imax), for example. Herein, electric power consumption is measured with respect to thermoelectric modules having various endothermic values on which semiconductor lasers are mounted. Measurement results are shown in FIG. 12, wherein a horizontal axis represents endothermic values for semiconductor lasers, and a vertical axis represents electric power consumption of thermoelectric modules. As endothermic values for semiconductor devices become large, electric power consumption of thermoelectric modules is correspondingly increased, so that currents flowing through thermoelectric modules are increased. This indicates that electric power consumption decreases in thermoelectric modules whose electrodes are relatively thick (or whose current transmission areas are relatively large) and whose current densities are relatively small. In particular, this invention may effectively work in reduction of electric power consumption with respect to semiconductor lasers having endothermic values of 4 W or more.

As described heretofore, this invention has a variety of effects and technical features, which will be described below.

(1) This invention is designed in such a way that in a thermoelectric module constituted by thermoelectric elements sandwiched between electrodes, a current density of a heat-absorbing-side electrode (e.g., an upper electrode) is set to 50 A/mm$^2$ or less, while the height of the thermoelectric element is set to 0.7 mm or less. Thus, it is possible to reliably prevent performance of the thermoelectric module from being reduced due to Joule heating.

(2) Specifically, a thermoelectric module of this invention is constituted by thermoelectric elements of p-types and n-types that are alternately arranged between upper electrodes and lower electrodes, wherein a current density of a current transmission area of the upper electrode(s) corresponding to the heat absorbing side is set to 50 A/mm$^2$ or less, while the height of the thermoelectric element is set to 0.7 mm or less.

(3) In addition, this invention can be applied to temperature-controlled semiconductor modules each containing a semiconductor laser and a thermoelectric module, wherein it is possible to noticeably reduce electric power consumption of the thermoelectric module in a prescribed range of endothermic values for the semiconductor laser.

As this invention may be embodied in several forms without departing from the spirit or essential characteristics thereof, the present embodiment is therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. A thermoelectric module comprising:

a first substrate for absorbing heat;

a plurality of first electrodes arranged on a surface of the first substrate, the plurality of first electrodes each having a thickness;

a second substrate for radiating heat;

a plurality of second electrodes arranged on a surface of the second substrate, that are arranged opposite to the first substrate; and a plurality of thermoelectric elements that are sandwiched between the plurality of first electrodes and the plurality of second electrodes, each of the plurality of thermoelectric elements having a cross-sectional area parallel to the electrodes and a height of 0.7 mm or less, wherein the plurality of thermoelectric elements are of a p-type and an n-type that are arranged alternately, so that the thermoelectric elements are connected in series or in parallel together with the first electrodes and the second electrodes, wherein the thickness of the plurality of first electrodes and the cross-sectional area of the plurality of thermoelectric elements are adjusted such that a current density in a current transmission area of the plurality of first electrodes is 50 A/mm2 or less at a maximum drive current of the thermoelectric module.

2. A temperature-controlled semiconductor module comprising:

a semiconductor component; and a thermoelectric module, the thermoelectric module comprising a first substrate for absorbing heat, a plurality of first electrodes arranged on a surface of the first substrate, the plurality of first electrodes each having a thickness, a second substrate for radiating heat, a plurality of second electrodes arranged on a surface of the second substrate that are arranged opposite to the first substrate, and a plurality of thermoelectric elements that are sandwiched between the plurality of first electrodes and the plurality of second electrodes, each of the plurality of thermoelectric elements having a cross-sectional area parallel to the electrodes and a height of 0.7 mm or less, wherein the plurality of thermoelectric elements are of a p-type and an n-type that are arranged alternately, so that the thermoelectric elements are connected in series or in parallel together with the first electrodes and the second electrodes, wherein the thickness of the plurality of first electrodes and the cross-sectional area of the plurality of thermoelectric elements are adjusted such that a current density of a current transmission area of the plurality of first electrode is set to 50 A/mm2 or less at a maximum drive current of the thermoelectric module.

3. A method for manufacturing a thermoelectric module, the method comprising:

providing a first substrate as a heat absorbing body;

arranging a plurality of first electrodes on a surface of the first substrate, the plurality of first electrodes each having a thickness;

providing a second substrate as a heat radiating body;

arranging a plurality of second electrodes on a surface of the second substrate, that are arranged opposite to the first substrate;

sandwiching a plurality of thermoelectric elements between the plurality of first electrodes and the plurality of second electrodes, each of the thermoelectric elements having a cross-sectional area parallel to the electrodes and a height of 0.7 mm or less, wherein the plurality of thermoelectric elements are of a p-type and an n-type that are arranged alternately, so that the thermoelectric elements are connected in series or in parallel together with the plurality of first electrodes and the plurality of second electrodes; and adjusting the thickness of the plurality of first electrodes and the cross-sectional area of the plurality of thermoelectric elements such that a current density in a current transmission area of the plurality of first electrodes is 50 A/mm2 or less at a maximum drive current of the thermoelectric module.

4. A method for manufacturing a temperature-controlled semiconductor module comprised of a semiconductor component and a thermoelectric module, the method comprising:

providing the semiconductor component; and providing the thermoelectric module, the step of providing the thermoelectric module further comprising providing a first substrate as a heat absorbing body, arranging a plurality of first electrodes on a surface of the first substrate, the plurality of first electrodes each having a thickness, providing a second substrate as a heat radiating body, arranging a plurality of second electrodes on a surface of the second substrate, that are arranged opposite to the first substrate, sandwiching a plurality of thermoelectric elements between the plurality of first electrodes and the plurality of second electrodes, each of the thermoelectric elements having a cross-sectional area parallel to the electrodes and a height of 0.7 mm or less, wherein the plurality of thermoelectric elements are of a p-type and an n-type that are arranged alternately, so that the thermoelectric elements are connected in series or in parallel together with the plurality of first electrodes and the plurality of second electrodes, and adjusting the thickness of the plurality of first electrodes and the cross-sectional area of the plurality of thermoelectric elements such that a current density in a current transmission area of the plurality of first electrodes is 50 A/mm$^2$ or less at a maximum drive current of the thermoelectric module.

* * * * *